(12) United States Patent
Negishi

(10) Patent No.: US 10,930,467 B2
(45) Date of Patent: Feb. 23, 2021

(54) SAMPLE HOLDER SYSTEM AND SAMPLE OBSERVATION APPARATUS

(71) Applicant: JEOL Ltd., Tokyo (JP)

(72) Inventor: Tsutomu Negishi, Tokyo (JP)

(73) Assignee: JEOL Ltd., Tokyo (JP)

( * ) Notice: Subject to any disclaimer, the term of this patent is extended or adjusted under 35 U.S.C. 154(b) by 295 days.

(21) Appl. No.: 16/004,927

(22) Filed: Jun. 11, 2018

(65) Prior Publication Data

US 2018/0358201 A1 Dec. 13, 2018

(30) Foreign Application Priority Data

Jun. 12, 2017 (JP) .................................. 2017-115002

(51) Int. Cl.
*H01J 37/20* (2006.01)
*H01J 37/30* (2006.01)
*H01J 37/305* (2006.01)

(52) U.S. Cl.
CPC .......... *H01J 37/20* (2013.01); *H01J 37/3005* (2013.01); *H01J 37/3053* (2013.01); *H01J 2237/2007* (2013.01); *H01J 2237/31745* (2013.01)

(58) Field of Classification Search
CPC .... H01J 37/20; H01J 37/3005; H01J 37/3053; H01J 2237/2007; H01J 2237/31745
See application file for complete search history.

(56) References Cited

U.S. PATENT DOCUMENTS

2013/0220806 A1* 8/2013 Iwaya ..................... H01J 37/20
204/298.32

FOREIGN PATENT DOCUMENTS

JP        2006269342 A       10/2006

* cited by examiner

*Primary Examiner* — Joseph J Hail
*Assistant Examiner* — J Stephen Taylor
(74) *Attorney, Agent, or Firm* — The Webb Law Firm

(57) ABSTRACT

A sample holder system includes a sample holder and a sample adjusting unit. The sample holder includes a shielding plate, a holder body, a holding portion, and a fastening mechanism. The fastening mechanism fastens the holding portion to the holder body, the fastening mechanism preventing the holding portion from swinging when the holding portion is fastened to the holder body. The sample adjusting unit includes a position adjusting jig that comes into contact with the holding portion, and a swinging mechanism that supports the position adjusting jig such that the position adjusting jig is swingable.

5 Claims, 7 Drawing Sheets

SAMPLE HOLDER SYSTEM AND SAMPLE OBSERVATION APPARATUS

CROSS-REFERENCE TO RELATED APPLICATION

This application claims priority to Japanese Patent Application No. 2017-115002 filed Jun. 12, 2017, the disclosure of which is hereby incorporated in its entirety by reference

BACKGROUND OF THE INVENTION

1. Field of the Invention

The present invention relates to a sample holder system that positions a sample and a shielding plate on a sample holder that holds the sample to be used in an ion milling apparatus, and also relates to a sample observation apparatus including the sample holder system.

2. Description of the Related Art

In general, a sample observed under an electron microscope is etched with an ion beam emitted from an ion milling apparatus and is processed into a shape that is suitable for observation. Prior to the processing with the ion milling apparatus, the sample that is held by a sample holder is positioned relative to a shielding plate that blocks the ion beam.

A technique of positioning a sample to be processed and a shielding plate is disclosed by Japanese Unexamined Patent Application Publication No. 2006-269342. The technique employs a sample-mask unit body that is an integral body including a sample holder, a swinging mechanism that swings the sample holder, a mask that shields part of the sample, and a fine adjustment mechanism that finely adjusts the position of the mask.

In the technique according to Japanese Unexamined Patent Application Publication No. 2006-269342, however, since the sample-mask unit body includes the fine adjustment mechanism and the sample holder that are integrated with each other, there is a problem in that the number of components forming the sample-mask unit body increases, resulting in a complicated configuration.

The technique according to Japanese Unexamined Patent Application Publication No. 2006-269342 has another problem in that when an ion beam is applied to a sample, the fine adjustment mechanism may also be heated. Consequently, the fine adjustment mechanism may undergo thermal expansion, and the sample and the shielding plate may be displaced from each other. The technique has yet another problem in that the sample-mask unit body needs to be provided with a heat radiating mechanism, which makes the configuration of the sample-mask unit body more complicated.

SUMMARY OF THE INVENTION

In view of the above problems, it is an object of the present invention to provide a sample holder system and a sample observation apparatus each including a sample holder that holds a sample and has a simple configuration.

To solve the above problems and to achieve the above object of the present invention, a sample holder system according to the present invention includes a sample holder that holds a sample, and a sample adjusting unit that is disconnectably connected to the sample holder and positions the sample.

The sample holder includes a shielding plate, a holder body, a holding portion, and a fastening mechanism. The shielding plate covers part of a processing surface of the sample. The holder body holds one of the sample and the shielding plate. The holding portion holds an other of the sample and the shielding plate and is swingably supported by the holder body. The fastening mechanism fastens the holding portion to the holder body, the fastening mechanism preventing the holding portion from swinging when the holding portion is fastened to the holder body.

The sample adjusting unit includes a position adjusting jig and a swinging mechanism. The position adjusting jig comes into contact with the holding portion. The swinging mechanism supports the position adjusting jig such that the position adjusting jig is swingable.

A sample observation apparatus according to the present invention includes a sample holder system, an attaching stage to which the sample holder is detachably attached, and an observation unit through which the sample held by the sample holder is observed. As the sample holder system, the sample holder system according to the first aspect of the present invention is employed.

In each of the sample holder system and the sample observation apparatus according to the respective aspects of the present invention, the sample holder that holds the sample can have a simple configuration.

DESCRIPTION OF THE PREFERRED EMBODIMENTS

Figure 1:
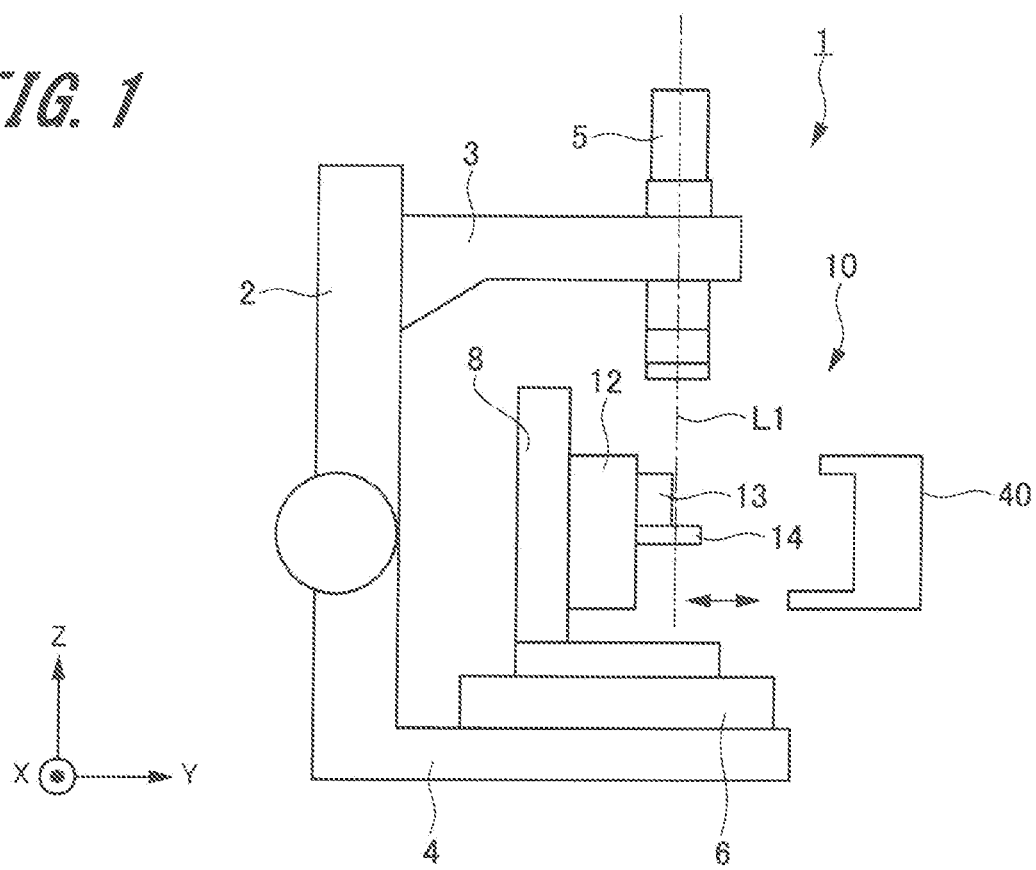
FIG. 1 is an outline diagram of a sample observation apparatus according to an embodiment of the present invention.

Embodiments of the sample holder system and the sample observation apparatus according to the present invention will now be described with reference to FIGS. 1 to 9, wherein like elements are denoted by like reference numerals.

1. Configuration of Sample Observation Apparatus

A sample observation apparatus according to an embodiment of the present invention will first be described with reference to FIG. 1.

FIG. 1 is an outline diagram of a sample observation apparatus 1 according to the embodiment.

The sample observation apparatus 1 illustrated in FIG. 1 is used for, for example, the positioning of a sample to be processed by an ion milling apparatus and a shielding plate relative to each other, and the observation of the state of the processed sample. The sample observation apparatus 1 is a so-called optical microscope including an eyepiece and an objective lens.

As illustrated in FIG. 1, the sample observation apparatus 1 includes a housing 2, a supporting portion 3, an installation base 4, an observation unit 5, an attaching stage 6, a holder stand 8, and a sample holder system 10. The supporting portion 3 is provided at one end of the housing 2. The observation unit 5 is attached to the supporting portion 3. The observation unit 5 includes an eyepiece and an objective lens. The observation unit 5 further includes a camera that takes an image of an object of observation.

The installation base 4 is provided at the other end of the housing 2 and faces toward the observation unit 5 supported by the supporting portion 3. The installation base 4 carries the attaching stage 6 on a surface thereof that faces toward the observation unit 5. The attaching stage 6 supports the sample holder system 10 and is movable in a first direction X and a second direction Y that are orthogonal to an optical axis L1 of the objective lens of the observation unit 5. Hereinafter, a direction that is parallel to the optical axis L1 and is orthogonal to the first direction X and the second direction Y, i.e., a direction parallel to the optical axis L1, is referred to as a third direction Z.

The holder stand 8 is detachably attached to the attaching stage 6. The holder stand 8 stands in the third direction Z on a surface of the attaching stage 6. A sample holder 12 included in the sample holder system 10 to be described below is detachably attached to a surface of the holder stand 8.

2. Sample Holder System 2-1. Exemplary Configuration of Sample Holder System

Figure 2:
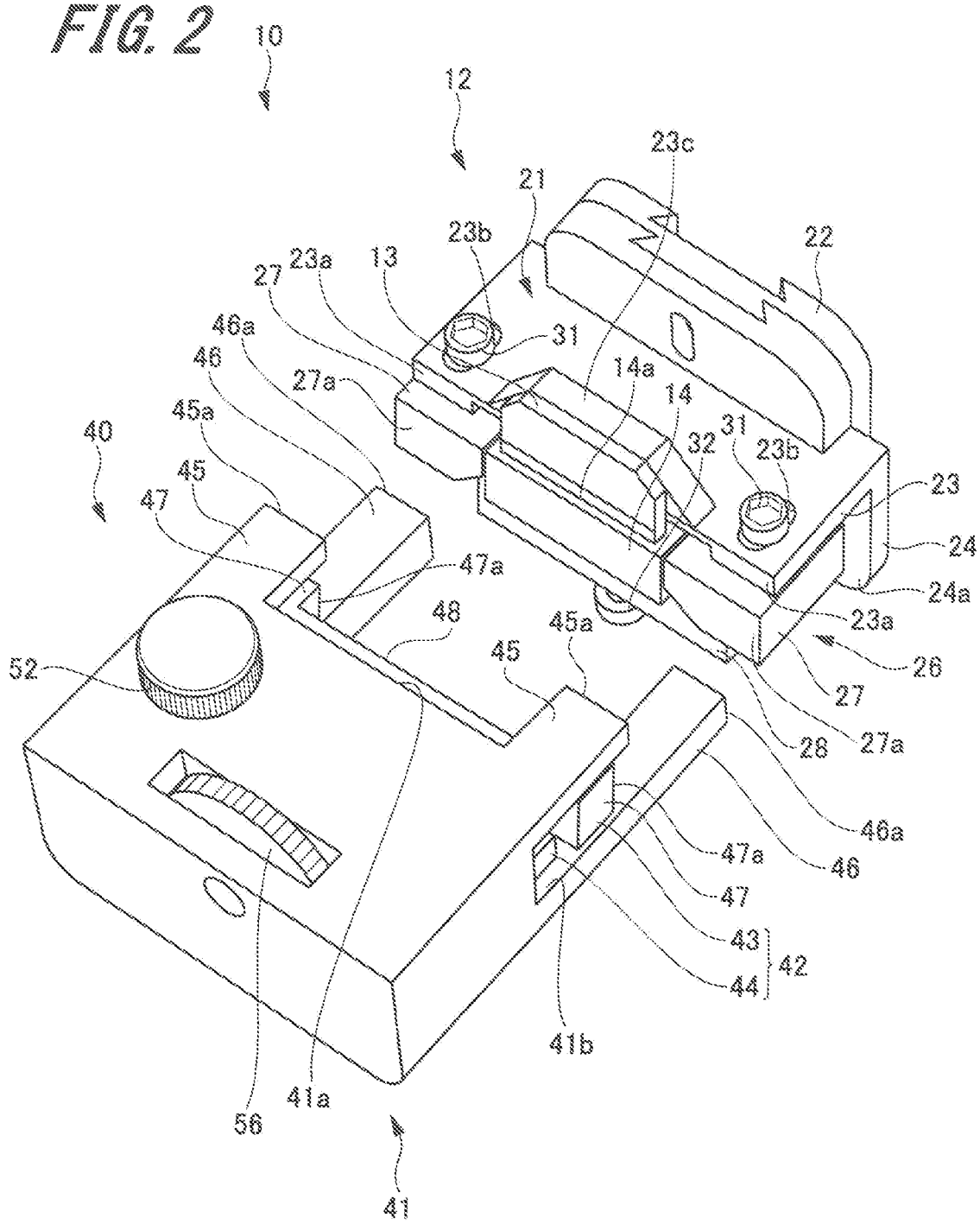
FIG. 2 is a perspective view of a sample holder system according to the embodiment of the present invention.

An exemplary configuration of the sample holder system 10 will now be described with reference to FIGS. 1 to 6. FIG. 2 is a perspective view of the sample holder system 10.

As illustrated in FIGS. 1 and 2, the sample holder system 10 includes the sample holder 12 and a sample adjusting unit 40. The sample adjusting unit 40 is disconnectably connected to the sample holder 12. The sample adjusting unit 40 positions a sample 14 relative to a shielding plate 13. The sample 14 is held by the sample holder 12. The sample holder 12 is detachably attached to the holder stand 8.

The sample holder 12 releasably holds the sample 14. The sample holder 12 includes the shielding plate 13. The sample 14 is positioned on a far side with respect to the shielding plate 13, provided to the sample holder 12, in a direction of travel of the ion beam emitted from the ion milling apparatus along the optical axis L1 of the observation unit 5, i.e., in the third direction Z. Hereinafter, the near side and the far side in each of the first direction X, the second direction Y, and the third direction Z in FIG. 2 are referred to as "the first side" and "the second side," respectively.

Figure 3:
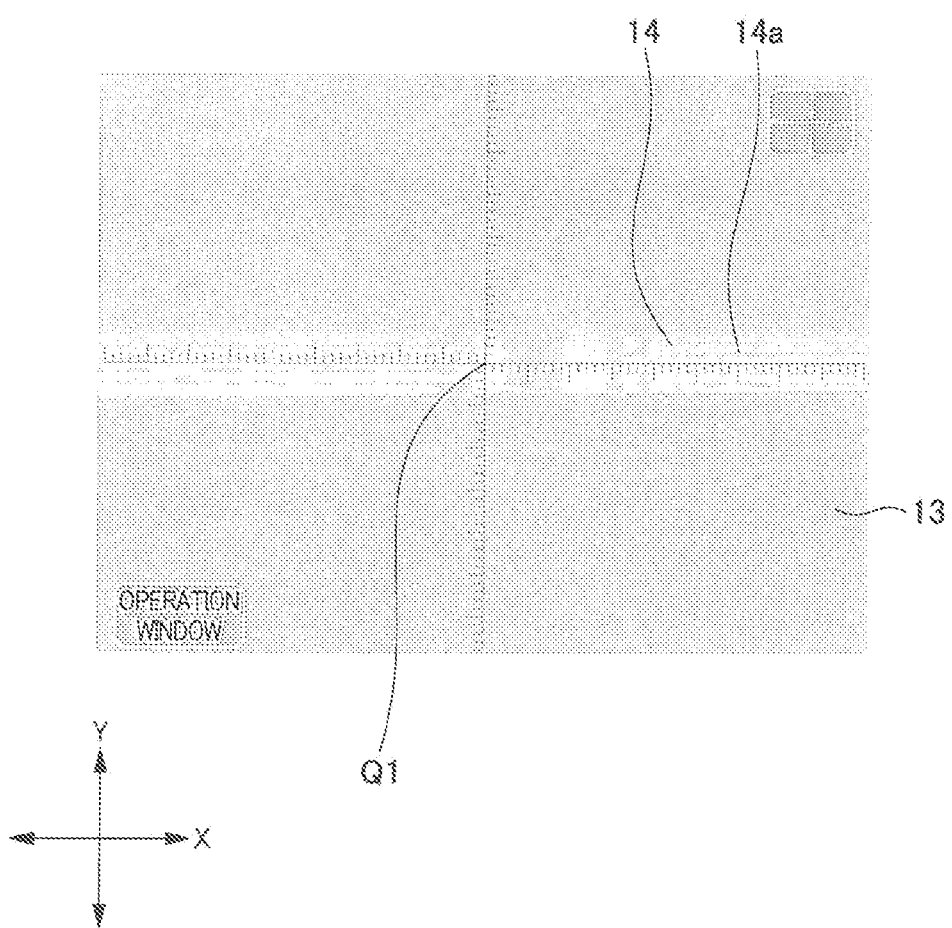
FIG. 3 is an image of a sample that is taken by an observation unit included in the sample observation apparatus according to the embodiment of the present invention.
Figure 4:
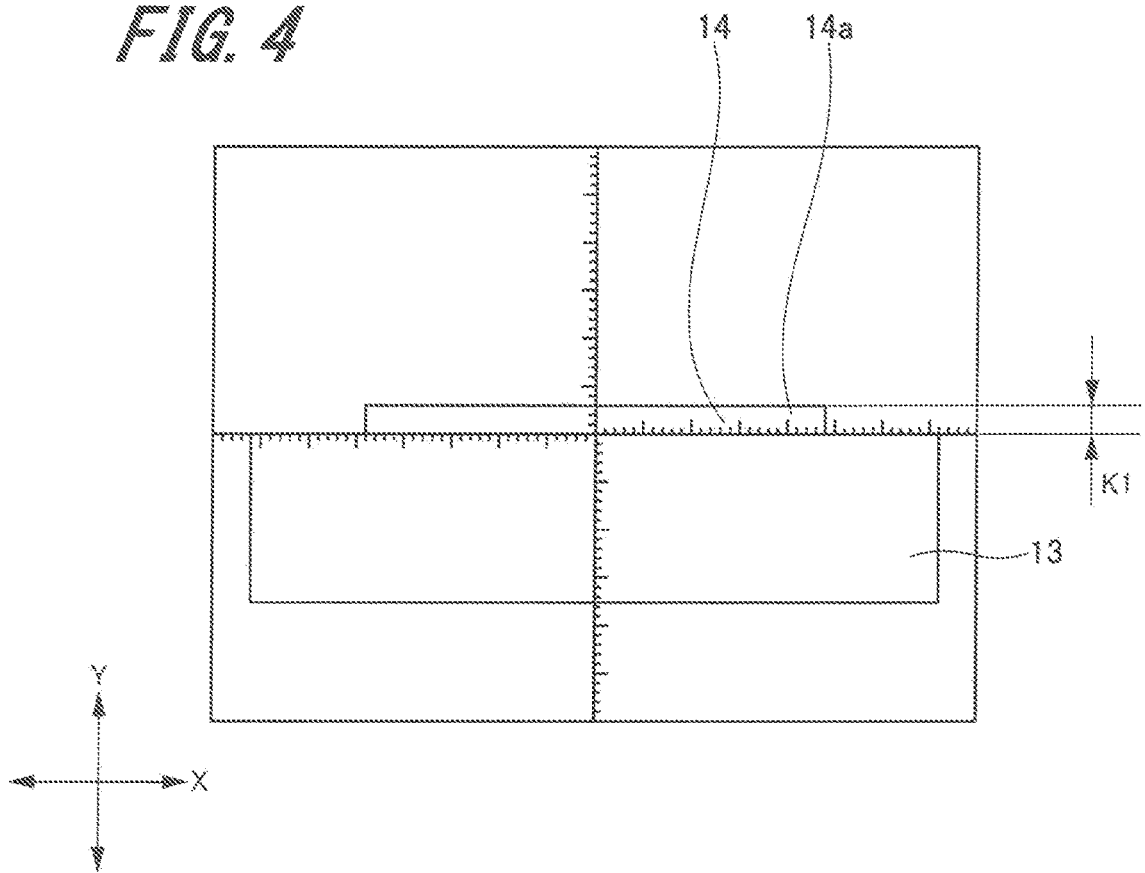
FIG. 4 is a schematic diagram illustrating a state where the sample is observed through the observation unit of the sample observation apparatus according to the embodiment of the present invention.
Figure 5:
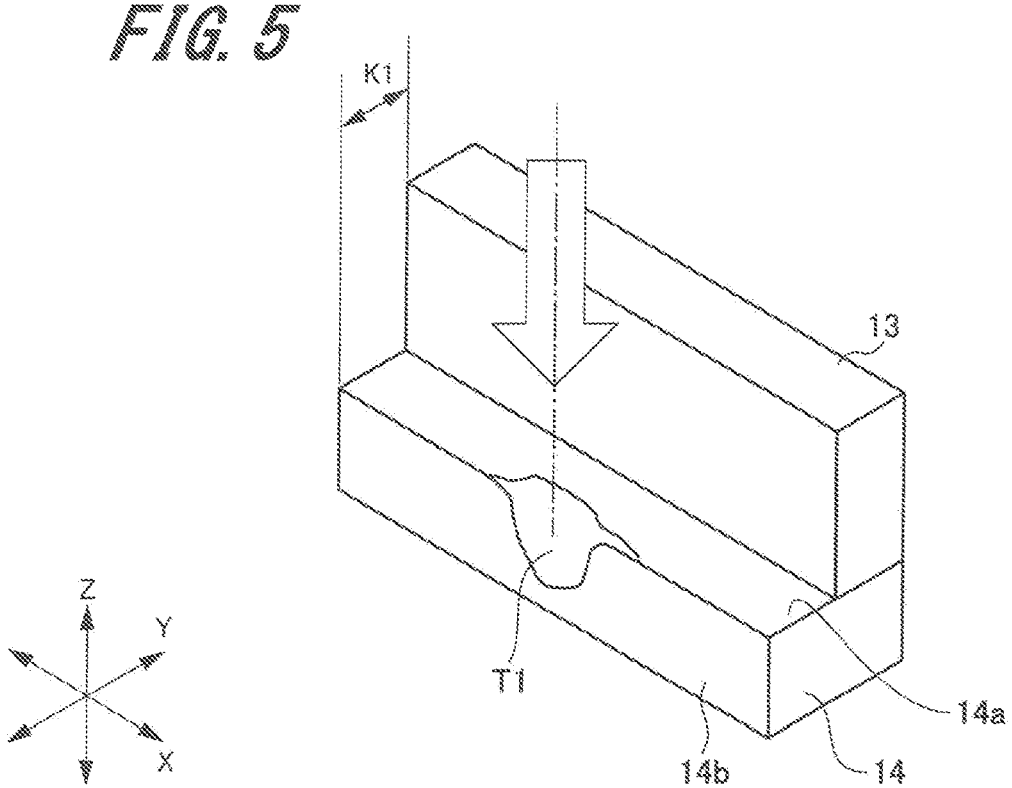
FIG. 5 is a schematic diagram illustrating the positional relationship between the sample and a shielding plate.

Referring now to FIGS. 3 to 5, the positional relationship between the shielding plate 13 and the sample 14 will now be described.

FIG. 3 is an image of the sample 14 that is taken by the camera included in the observation unit 5. FIG. 4 is a schematic diagram of the image. FIG. 5 is a schematic diagram illustrating the positional relationship between the sample 14 and the shielding plate 13.

As illustrated in FIGS. 3 to 5, the sample 14 has a substantially flat plate-like shape. As illustrated in FIGS. 3 and 4, the sample 14 has a processing surface 14a that faces against the optical axis L1 of the observation unit 5 or the ion beam emitted from the ion milling apparatus, and a side surface 14b that extends substantially perpendicularly from one end of the processing surface 14a and is continuous with the processing surface 14a. The side surface 14b extends substantially parallel to the third direction Z.

When the sample 14 is held by the sample holder 12, part of the sample 14 projects from one surface of the shielding plate 13 by a predetermined length in the direction orthogonal to the optical axis L1, i.e., the third direction Z. The direction orthogonal to the optical axis L1 and the third direction Z and in which the sample 14 projects from the shielding plate 13 corresponds to the second direction Y. The direction parallel to the processing surface 14a, i.e., the direction orthogonal to the optical axis L1 and the third direction Z, and orthogonal to the second direction Y corresponds to the first direction X.

The length by which the sample 14 projects in the second direction Y from the one surface of the shielding plate is hereinafter denoted as length of projection K1. In the above state, the processing surface 14a, which is a surface of the sample 14 that is on one of the two sides in the third direction Z, faces against the optical axis L1 of the observation unit 5. Therefore, the ion beam emitted from the ion milling apparatus is applied to the processing surface 14a.

The user visually observe the sample 14 and the shielding plate 13 through the observation unit 5 and operates the sample holder system 10 to adjust the length of projection K1 and a processing position Q1 (see FIG. 3) where the processing surface 14a of the sample 14 is to be processed. The user operates the sample holder system 10 to adjust the inclination of the side surface 14b of the sample 14 with respect to the first direction X.

As illustrated in FIG. 5, the ion milling apparatus applies an ion beam to the processing surface 14a of the sample 14. The ion beam is blocked by the shielding plate 13 positioned on the first side in the third direction Z with respect to the sample 14. Therefore, in the sample 14 positioned on the second side in the third direction Z with respect to the shielding plate 13, a portion of the processing surface 14a that is covered by the shielding plate 13 remains unetched with the ion beam, whereas the portion of the processing surface 14a that projects from the shielding plate 13 by the length of projection K1 is etched with the ion beam. Consequently, a processed profile T1 is obtained over the processing surface 14a of the sample 14 and the side surface 14b that extends substantially perpendicularly to and continuous with the processing surface 14a.

Now, details of the sample holder system 10 will be described with reference to FIGS. 2 and 6.

Figure 6:
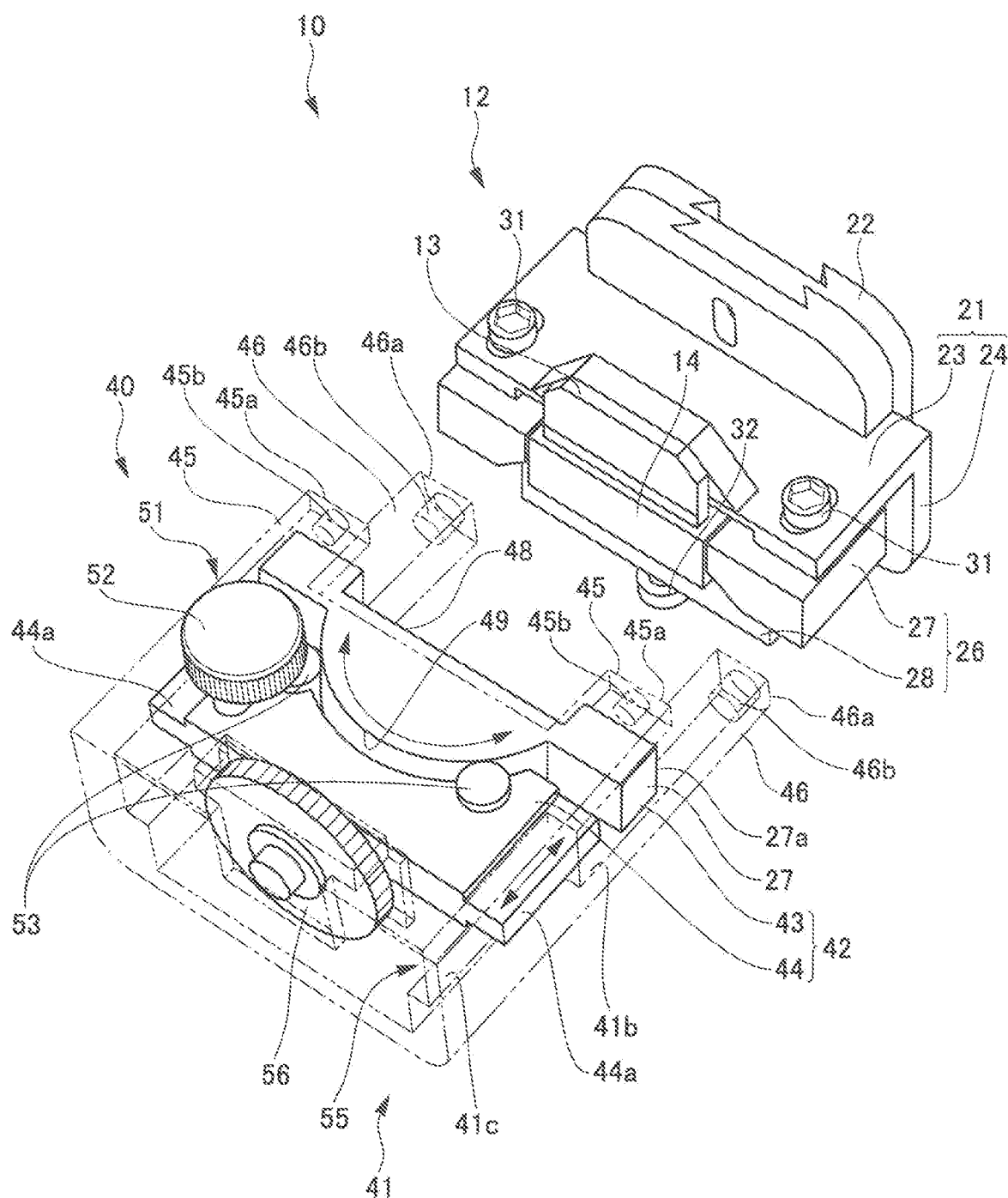
FIG. 6 is a perspective view of the sample holder system according to the embodiment of the present invention, with a sample adjusting unit being illustrated transparently.

FIG. 6 is a perspective view of the sample holder system 10, with sample adjusting unit 40 being illustrated transparently.

[Sample Holder]

The sample holder 12 will first be described.

Referring to FIGS. 2 and 6, the sample holder 12 includes the shielding plate 13, a holder body 21, a holder-side attachment 22, a sample holding portion 26 as an exemplary holding portion, and fastening screws 31. The holder-side attachment 22 is detachably attached to the holder stand 8 (see FIG. 1). The holder-side attachment 22 and the holder body 21 are integrated with each other.

The holder body 21 projects from the holder-side attachment 22 toward the first side in the second direction Y. The holder body 21 has a substantially L shape. The holder body 21 includes a first supporting portion 23 and a second supporting portion 24.

The first supporting portion 23 projects in the second direction Y from the holder-side attachment 22. The first supporting portion 23 has a securing member 23c at the first-side end thereof in the second direction Y. The securing member 23c secures the shielding plate 13. The shielding plate 13 is made of a material having higher strength with respect to the ion beam than the sample 14. The shielding plate 13 blocks the ion beam emitted from the ion milling apparatus.

The first supporting portion 23 has two first holder-side connecting surfaces 23a at two respective ends thereof in the first direction X at the first-side end thereof in the second direction Y. The two first holder-side connecting surfaces 23a are positioned at two respective ends, in the first direction X, of the shielding plate 13 secured to the first supporting portion 23. The first holder-side connecting surfaces 23a are each provided with a magnetic member such as a magnet or a metal member. The first holder-side connecting surfaces 23a receive first unit-side connecting surfaces 45a, respectively, to be connected thereto. The first unit-side connecting surfaces 45a are included in the sample adjusting unit 40, which will be described separately below.

The first supporting portion 23 has two securing holes 23b at two respective ends thereof in the first direction X. The two securing holes 23b each extend through the first supporting portion 23 in the third direction Z. The two securing holes 23b are each an oblong hole whose length is longer in the second direction Y than in the first direction X.

The securing holes 23b receive threaded portions of the respective fastening screws 31 inserted thereinto. The fastening screws 31 are exemplary fastening mechanisms. The threaded portions of the fastening screws 31 each have play in the first direction X and in the second direction Y. Hence, in a state where the fastening screws 31 are loosened, the fastening screws 31 are supported in such a manner as to be movable in the second direction Y within the respective securing holes 23b.

The first supporting portion 23 is substantially perpendicularly continuous with the second supporting portion 24 at the second-side end thereof in the second direction Y. The second supporting portion 24 projects from the second-side end of the first supporting portion 23 in the second direction Y toward the second side in the third direction Z.

The second supporting portion 24 has two second holder-side connecting surfaces 24a at two respective ends thereof in the first direction X at the second-side end thereof in the third direction Z. The second holder-side connecting surfaces 24a are each provided with a magnetic member such as a magnet or a metal member. The second holder-side connecting surfaces 24a receive second unit-side connecting surfaces 46a, respectively, to be connected thereto. The second unit-side connecting surfaces 46a are included in the sample adjusting unit 40, which will be described separately below.

The sample holding portion 26 that holds the sample 14 is positioned on the second side, in the third direction Z, of the first supporting portion 23 of the holder body 21. The sample holding portion 26 is fastened to the first supporting portion 23 of the holder body 21 with the two fastening screws 31. The fastening mechanism for fastening the sample holding portion 26 to the holder body 21 is not limited to the fastening screws 31 and may be any of other fastening mechanisms such as securing pins or securing hooks.

The sample holding portion 26 includes two handle portions 27, a sample mounting table 28, and a retaining screw 32. The two handle portions 27 are provided on two respective sides in the first direction X with a gap interposed therebetween. The sample 14 is placed and held between the two handle portions 27.

The handle portions 27 have pressed surfaces 27a each provided at the first-side end thereof in the second direction Y. The pressed surfaces 27a extend in the third direction Z. The pressed surfaces 27a receive pressing surfaces 47a of pressing portions 47 to be connected thereto. The pressing portions 47 are included in the sample adjusting unit 40 to be described below. The handle portions 27 receive the fastening screws 31 that are screwed thereinto through the securing holes 23b, respectively. Hence, the sample holding portion 26 is fastened to the holder body 21 with the fastening screws 31 screwed thereinto.

The sample mounting table 28 is positioned on the second side in the third direction Z with respect to the two handle portions 27. The sample mounting table 28 is provided on the second side in the third direction Z with respect to the handle portions 27 and extends in such a manner as to connect the two handle portions 27. When the sample holding portion 26 is fastened to the holder body 21, the sample mounting table 28 faces toward the first supporting portion 23 and the shielding plate 13 in the third direction Z.

The sample mounting table 28 carries the sample 14 mounted thereon. The sample mounting table 28 is provided with the retaining screw 32 screwed thereinto from the second side in the third direction Z. With the retaining screw 32 fastened, the sample 14 is held between the retaining screw 32 and the first supporting portion 23 of the holder body 21. Furthermore, since the sample 14 is pressed by the retaining screw 32 toward the first side in the third direction Z, the sample 14 comes into close contact with the shielding plate 13. Consequently, the gap between the sample 14 and the shielding plate 13 can be eliminated, and the occurrence of defects in the processing performed in the ion milling apparatus can be prevented.

In the state where the fastening screws 31 are fastened, the sample holding portion 26 is supported by the holder body 21 in such a manner as to be movable in the second direction Y. There is a small gap in the first direction X between the threaded portion of each of the fastening screws 31 and a corresponding one of the securing holes 23b. Therefore, the sample holding portion 26 supported by the holder body 21 is swingable in a plane defined by the first direction X and the second direction Y. When the fastening screws 31 are fastened, the sample holding portion 26 is fastened to the holder body 21 and is prevented from moving and swinging.

[Sample Adjusting Unit]

The sample adjusting unit 40 will now be described.

Referring to FIGS. 2 and 6, the sample adjusting unit 40 includes a unit body 41, a position adjusting jig 42, a swinging mechanism 51, and a moving mechanism 55. The unit body 41 has a hollow substantially rectangular-parallelepiped shape. An end of the unit body 41 on the second side in the second direction Y is open. The unit body 41 includes two first unit-side connecting portions 45 and two second unit-side connecting portions 46, at the end thereof that faces the sample holder 12, i.e., at the end thereof on the second side in the second direction Y.

The two first unit-side connecting portions 45 are provided at the two respective ends of the unit body 41 in the first direction X. Likewise, the two second unit-side connecting portions 46 are provided at the two respective ends of the unit body 41 in the first direction X. The two first unit-side connecting portions 45 are provided at the first-side end of the unit body 41 in the third direction Z. The two second unit-side connecting portions 46 are provided at the second-side end of the unit body 41 in the third direction Z. The two first unit-side connecting portions 45 and the two second unit-side connecting portions 46 each project from the second-side end of the unit body 41 in the second direction Y toward the second side in the second direction Y.

The first unit-side connecting surfaces 45a at the tips of the respective first unit-side connecting portions 45 come into contact with the respective first holder-side connecting surfaces 23a. The first unit-side connecting portions 45 are provided with magnets 45b housed therein at the tips thereof, respectively. The first unit-side connecting portions 45 are connected to the respective first holder-side connecting surfaces 23a (see FIG. 7).

The second unit-side connecting surfaces 46a at the tips of the respective second unit-side connecting portions 46 come into contact with the respective second holder-side connecting surfaces 24a. The second unit-side connecting portions 46 are provided with magnets 46b housed therein at the tips thereof, respectively. The second unit-side connecting portions 46 are connected to the respective second holder-side connecting surfaces 24a (see FIG. 7).

The unit body 41 has an open recess 41a provided at the second-side end thereof in the second direction Y and defined by the two first unit-side connecting portions 45. The open recess 41a is provided between the two first unit-side connecting portions 45.

Furthermore, the unit body 41 has slits 41b provided at the two respective ends thereof in the first direction X. The slits 41b are each defined by a corresponding one of the first unit-side connecting portions 45 and a corresponding one of the second unit-side connecting portions 46. The slits 41b are each provided between the corresponding first unit-side connecting portion 45 and the corresponding second unit-side connecting portion 46.

Furthermore, the unit body 41 has moving rails 41c provided at the two respective ends thereof in the first direction X. The moving rails 41c extend in the second direction Y inside the unit body 41. The moving rails 41c are each continuous with a corresponding one of the slits 41b at the second-side end thereof in the second direction Y.

The unit body 41 is provided with the position adjusting jig 42 in a middle part thereof in the third direction Z. The position adjusting jig 42 includes a swingable member 43 and a movable member 44.

The movable member 44 has a substantially flat plate-like shape. The movable member 44 has slide portions 44a at the two respective ends thereof in the first direction X. The slide portions 44a are slidably in engagement with the respective moving rails 41c provided inside the unit body 41. Therefore, the movable member 44 supported by the unit body 41 is movable in the second direction Y.

The movable member 44 is provided with the moving mechanism 55 connected thereto. The moving mechanism 55 includes a projection-adjusting dial 56, a threaded feed shaft (not illustrated), and so forth. The threaded feed shaft extends in the second direction Y inside the unit body 41 and is rotatable. The threaded feed shaft is in mesh with the movable member 44. The threaded feed shaft is provided with the projection-adjusting dial 56 at an end thereof. The projection-adjusting dial 56 is rotatably supported by the unit body 41.

When the projection-adjusting dial 56 is rotated, the threaded feed shaft rotates. Since the threaded feed shaft and the movable member 44 are in mesh with each other, the rotation of the threaded feed shaft is converted into a moving force of the movable member 44 in the second direction Y. Thus, in accordance with the direction in which the projection-adjusting dial 56 is rotated, the movable member 44 moves toward the first side or the second side in the second direction Y.

The moving mechanism 55 is not limited to the above mechanism and may be any of various other mechanisms such as a mechanism employing a plurality of gears, or a mechanism including a slider.

A side of the movable member 44 that is nearer to the sample holder 12, i.e., the second-side end of the movable member 44 in the second direction Y, is recessed in a substantially arc shape toward the first side in the second direction Y. The movable member 44 is provided at the second-side end thereof in the second direction Y with swinging support rollers 53 included in the swinging mechanism 51 to be described below. The swingable member 43 is swingably connected to the second-side end of the movable member 44 in the second direction Y with the swinging support rollers 53 interposed therebetween. The swingable member 43 is movable in the second direction Y along with the movable member 44.

The swingable member 43 has a substantially flat plate-like shape. The swingable member 43 is supported by the swinging mechanism 51, to be described below, and the unit body 41 in such a manner as to be swingable in the plane defined by the first direction X and the second direction Y. The swingable member 43 includes the two pressing portions 47, a recess 48, and a shaft receiving surface 49.

The two pressing portions 47 are provided at the second-side end of the swingable member 43 in the second direction Y. The two pressing portions 47 are provided at the two respective ends of the swingable member 43 in the first direction X. Part of each of the pressing portions 47 projects into a corresponding one of the slits 41b of the unit body 41.

The pressing portions 47 have the pressing surfaces 47a at the respective second-side ends thereof in the second direction Y. The pressing surfaces 47a extend in the third direction Z. The pressing surfaces 47a face or come into contact with the respective pressed surfaces 27a of the handle portions 27 of the sample holder 12 (see FIG. 7).

The recess 48 is provided between the two pressing portions 47. The recess 48 is concave toward the first side of the swingable member 43 in the second direction Y. In a state where the pressing portions 47 are in contact with the respective pressed surfaces 27a of the handle portions 27, the recess 48 faces the sample 14 on the sample holder 12 with a gap interposed therebetween. The recess 48 is provided at a position visible in the third direction Z through the open recess 41a of the unit body 41.

The shaft receiving surface 49 is provided at the first-side end of the swingable member 43 in the second direction Y. The shaft receiving surface 49 projects in a substantially arc shape from the first-side end of the swingable member 43 toward the first side in the second direction Y. In the state where the sample adjusting unit 40 is connected to the sample holder 12, the center of the arc of the shaft receiving surface 49 is positioned above the shielding plate 13. The shaft receiving surface 49 is in contact with the two swinging support rollers 53 included in the swinging mechanism 51. The shaft receiving surface 49 is swingably supported by the two swinging support rollers 53.

The swinging mechanism 51 includes a swinging dial 52, the two swinging support rollers 53, and a transmission portion (not illustrated). The swinging dial 52 is rotatably supported by the unit body 41. The two swinging support rollers 53 are rotatably supported by the movable member 44. The swinging dial 52 is provided with the transmission portion (not illustrated) connected thereto. The transmission portion transmits the rotational force of the swinging dial 52 to the swingable member 43. Therefore, when the swinging dial 52 is operated, the swingable member 43 swings. The angle of swing of the swingable member 43 is set to, for example, about ±5 degrees with respect to the first direction X.

Part of each of the two pressing portions 47 of the swingable member 43 is positioned in a corresponding one of the slits 41*b* of the unit body 41. Therefore, when the swingable member 43 swings, the swinging motion of the swingable member 43 is prevented from being hindered by the interference of the two pressing portions 47 with the inner wall of the unit body 41.

The swinging mechanism 51 is not limited to the above mechanism and may be any of various other swinging mechanisms such as a mechanism employing a disc-shaped swingable table, or a mechanism employing a plurality of gears and/or cams.

In the sample holder system 10 according to the present embodiment, the swinging mechanism 51 and the moving mechanism 55 for adjusting the position of the sample 14 are provided to the sample adjusting unit 40, not to the sample holder 12. Therefore, the number of components of the sample holder 12 can be reduced, and the configuration can be simplified.

3. Sample Positioning Operation

An operation of positioning the sample 14 in the sample holder system 10 configured as above will now be described with reference to FIGS. 7 and 8.

Figure 7:
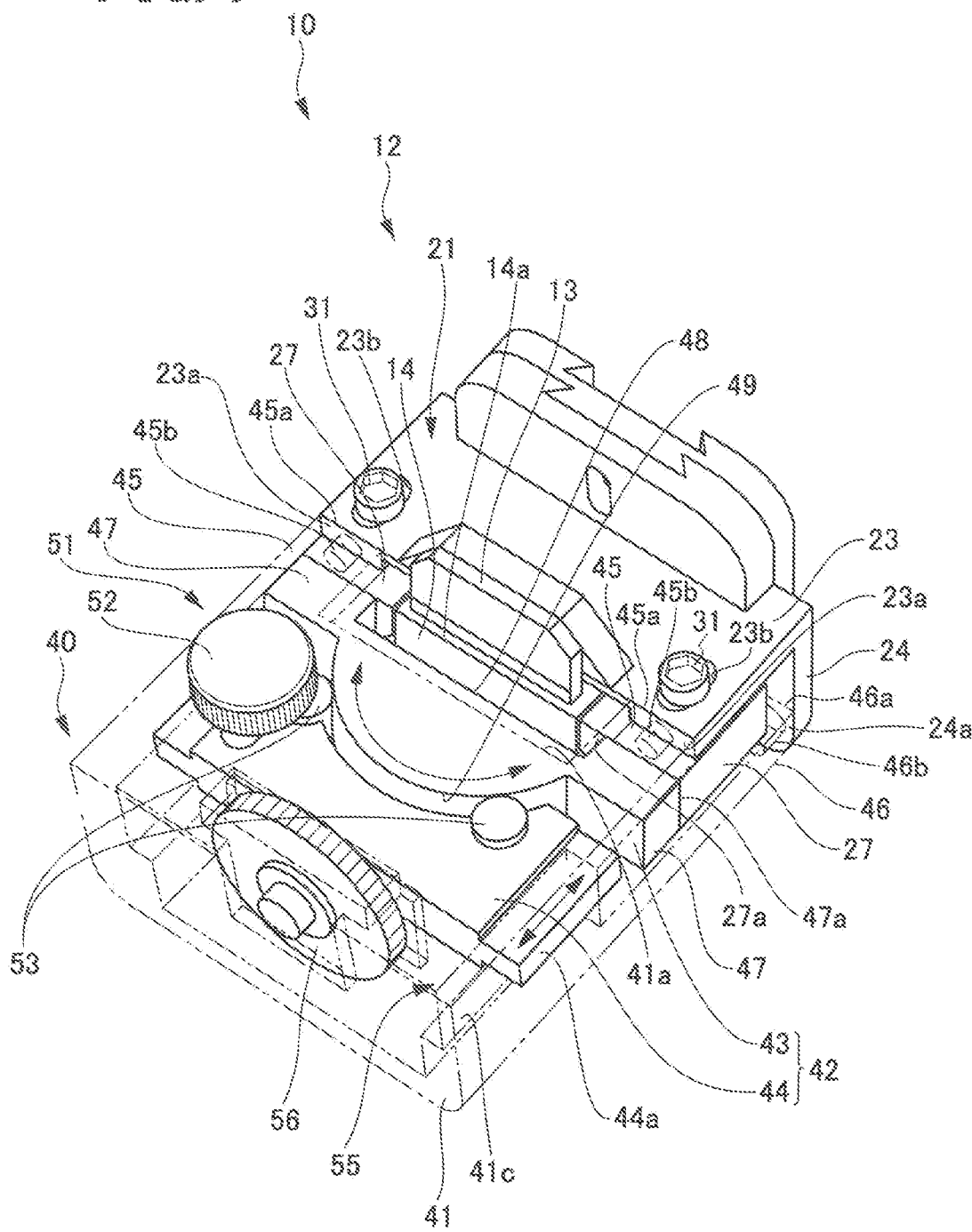
FIG. 7 is a perspective view of the sample holder system according to the embodiment of the present invention, with the sample holder and the sample adjusting unit connected to each other.

FIG. 7 is a perspective view of the sample holder 12 and the sample adjusting unit 40 that are connected to each other. FIG. 8 schematically illustrates an operation of positioning the sample 14 in the sample holder system 10.

Referring to FIGS. 2 and 6, the fastening screws 31 and the retaining screw 32 are loosened, and the sample holding portion 26 is moved toward the first side in the second direction Y. Thus, the sample 14 held by the sample holding portion 26 moves along with the sample holding portion 26 toward the first side in the second direction Y.

Figure 8:
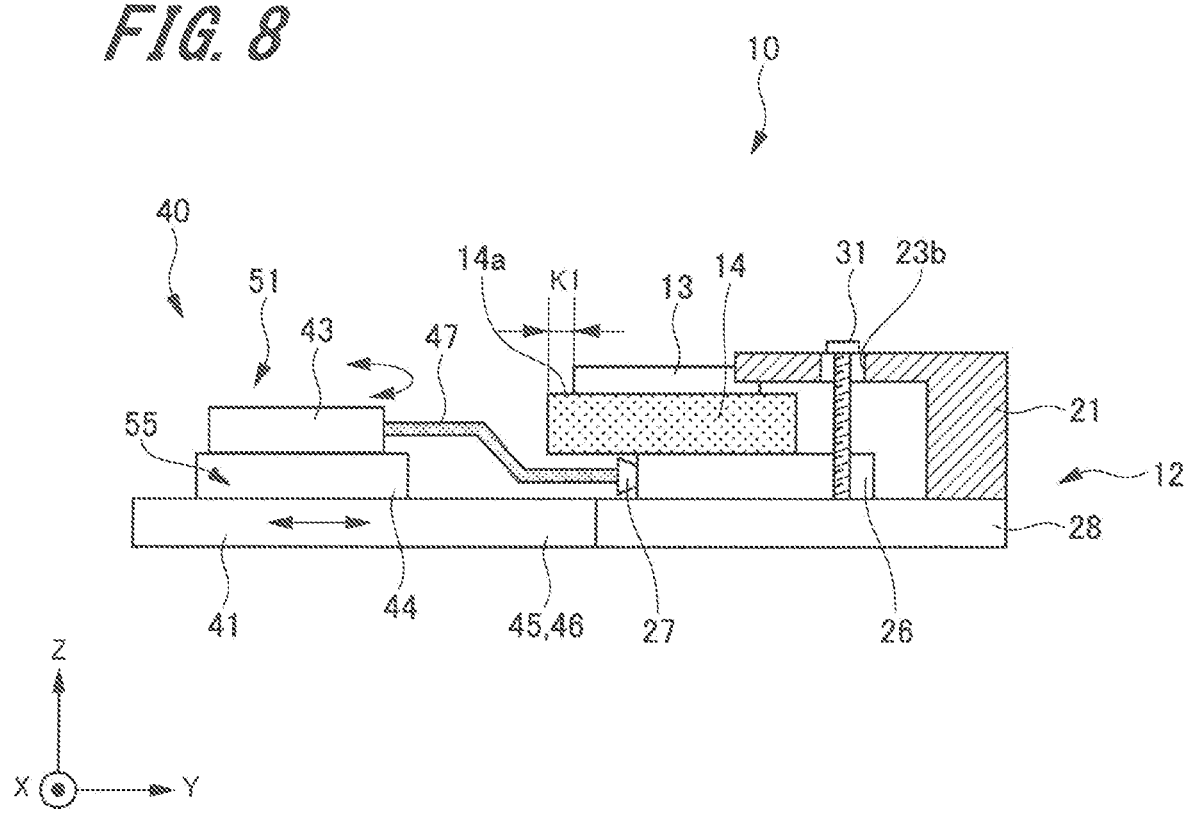
FIG. 8 schematically illustrates an operation of positioning the sample in the sample holder system according to the embodiment of the present invention.

Subsequently, as illustrated in FIGS. 7 and 8, the sample adjusting unit 40 is connected to the sample holder 12. Specifically, the first unit-side connecting surfaces 45*a* of the first unit-side connecting portions 45 are brought into contact with the respective first holder-side connecting surfaces 23*a,* and the second unit-side connecting surfaces 46*a* of the second unit-side connecting portions 46 are brought into contact with the respective second holder-side connecting surfaces 24*a*.

As described above, the first unit-side connecting portions 45 and the second unit-side connecting portions 46 are provided with the magnets 45*b* and 46*b* at the tips thereof, respectively. Furthermore, the first holder-side connecting surfaces 23*a* and the second holder-side connecting surfaces 24*a* are provided with magnets or magnetic members, respectively. Therefore, with the magnetic attracting force generated by the magnets 45*b* and 46*b,* the first holder-side connecting surfaces 23*a* and the first unit-side connecting surfaces 45*a* are connected to each other while the second holder-side connecting surfaces 24*a* and the second unit-side connecting surfaces 46*a* are connected to each other. Thus, the sample adjusting unit 40 is connected to the sample holder 12.

Another configuration may be employed in which the first holder-side connecting surfaces 23*a* and the second holder-side connecting surfaces 24*a* are provided with magnets while the first unit-side connecting portions 45 and the second unit-side connecting portions 46 are provided with magnetic members. Yet another configuration may be employed in which the first holder-side connecting surfaces 23*a* and the second holder-side connecting surfaces 24*a,* and the first unit-side connecting portions 45 and the second unit-side connecting portions 46 may all be provided with magnets.

While the present embodiment concerns an exemplary method of connecting the sample adjusting unit 40 to the sample holder 12 with the magnets 45*b* and 46*b,* the present invention is not limited to such an embodiment. To connect the sample adjusting unit 40 to the sample holder 12, any of various other connecting methods may be employed, such as fastening with screws, locking with a hook and a hook receiver, or the like. Nevertheless, the two can be connected or disconnected easily by the connecting method employing the magnets 45*b* and 46*b* according to the present embodiment.

When the sample adjusting unit 40 is connected to the sample holder 12, the pressing surfaces 47*a* of the pressing portions 47 face or come into contact with the respective pressed surfaces 27*a* of the handle portions 27, and the recess 48 faces the sample 14. If the pressed surfaces 27*a* and the pressing surfaces 47*a* face each other with gaps therebetween, the position adjusting jig 42 is moved toward the second side in the second direction Y by operating the projection-adjusting dial 56 of the sample adjusting unit 40 until the pressing surfaces 47*a* come into contact with the pressed surfaces 27*a*.

Subsequently, the sample 14 and the shielding plate 13 are visually checked through the observation unit 5, and the swinging dial 52 and the projection-adjusting dial 56 included in the sample adjusting unit 40 are operated. The unit body 41 of the sample adjusting unit 40 has the open recess 41*a*. That is, the first sides of the sample 14 and the shielding plate 13 in the third direction Z are exposed to the outside. Therefore, the states of the sample 14 and the shielding plate 13 are observable through the observation unit 5.

When the projection-adjusting dial 56 is operated, the position adjusting jig 42 moves in the second direction Y. Accordingly, the handle portions 27 is pressed in the second direction Y by the pressing portions 47 of the position adjusting jig 42. Thus, the sample holding portion 26 and the sample 14 move in the second direction Y. Thus, the length of projection K1 of the sample 14 from the shielding plate 13 can be adjusted.

When the swinging dial 52 is operated, the swingable member 43 of the position adjusting jig 42 swings in the plane defined by the first direction X and the second direction Y. Therefore, either of the two handle portions 27 is pressed by a corresponding one of the pressing portions 47 of the position adjusting jig 42. Accordingly, the sample holding portion 26 and the sample 14 swing in the plane defined by the first direction X and the second direction Y. Thus, the angle of the side surface 14b (see FIG. 5) of the sample 14 can be adjusted such that the side surface 14b becomes parallel to the first direction X or is at any degree with respect to the first direction X.

Either the handle portions 27 or the pressing portions 47 may be provided with magnets while the other may be provided with magnetic members. Alternatively, both the handle portions 27 and the pressing portions 47 may be provided with magnets. Thus, the pressing surfaces 47a of the pressing portions 47 can be assuredly brought into contact with the pressed surfaces 27a of the handle portions 27. Consequently, the adjustment error can be reduced.

When the positioning of the sample 14 is complete, the fastening screws 31 and the retaining screw 32 are fastened. Thus, the sample holding portion 26 is fastened to the holder body 21, and the sample 14 is held between the retaining screw 32 and the first supporting portion 23. Consequently, the sample holding portion 26 and the sample 14 are prevented from moving and swinging.

Subsequently, the sample adjusting unit 40 is removed from the sample holder 12. Thus, the operation of positioning the sample 14 in the sample holder system 10 is complete.

The operation of positioning the sample 14 is not limited to the above. For example, before the sample adjusting unit 40 is connected to the sample holder 12, the position of the position adjusting jig 42 in the second direction Y and the angle of swing of the swingable member 43 may be adjusted to a predetermined position and a predetermined angle in advance by operating the projection-adjusting dial 56 and the swinging dial 52.

Subsequently, the sample adjusting unit 40 operated as above for adjustment is connected to the sample holder 12. Then, the fastening screws 31 are loosened, and the sample holding portion 26 is moved and swung until the pressed surfaces 27a of the two handle portions 27 come into contact with the pressing surfaces 47a of the two pressing portions 47, respectively. When the pressed surfaces 27a of the two handle portions 27 come into contact with the respective pressing surfaces 47a of the two pressing portions 47, the sample holding portion 26 is stopped. Then, the fastening screws 31 are fastened, and the sample adjusting unit 40 is removed from the sample holder 12. The sample 14 may be positioned in such a process.

Figure 9:
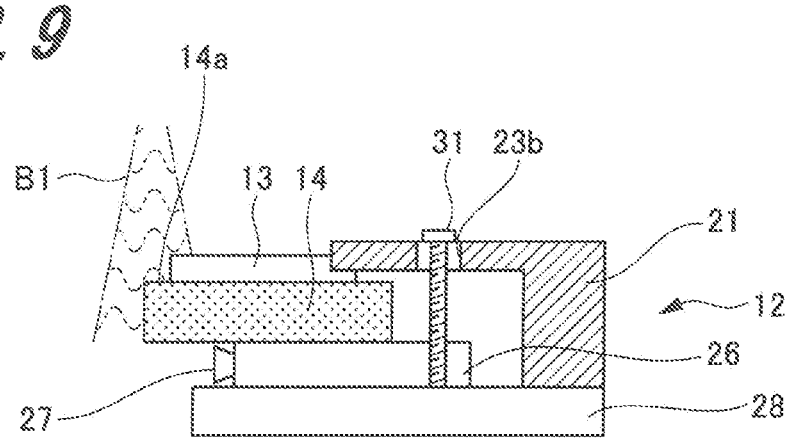
FIG. 9 schematically illustrates a state where an ion beam is applied to the sample in the sample holder system according to the embodiment of the present invention.

FIG. 9 schematically illustrates a state where an ion beam B1 is applied to the sample 14 in the sample holder system 10.

As illustrated in FIG. 9, to etch the sample 14 with the ion beam B1 applied thereto, the sample adjusting unit 40 including the swinging mechanism 51 and the moving mechanism 55 is removed from the sample holder 12. Hence, there is no chance that the sample adjusting unit 40 may be heated by the ion beam B1. Accordingly, there is no chance that the sample 14 and the shielding plate 13 may be displaced with respect to each other because of the thermal expansion of the sample adjusting unit 40. Consequently, no heat radiating mechanism for cooling the sample adjusting unit 40 is necessary in the sample holder system 10, the number of components of the sample holder system 10 can be reduced, and the configuration of the sample holder system 10 can be simplified.

The number of components of the sample holder 12 is also reduced, and the configuration of the sample holder 12 is also simplified. Furthermore, the sample holding portion 26 that holds the sample 14 is fastened to the holder body 21 with the fastening screws 31 and is therefore prevented from moving and swinging. Consequently, when the sample 14 is etched with the ion beam B1 applied thereto, the sample 14 is prevented from being displaced.

While the above embodiment concerns a case where the sample observation apparatus is applied to an optical microscope, the present invention is not limited to such an embodiment. The sample observation apparatus may be applied to an ion milling apparatus including an observation unit for observing a sample, and an ion-beam-applying unit that applies an ion beam to the sample; or any of other various apparatuses.

While the above embodiment concerns a case where the position adjusting jig 42 of the sample adjusting unit 40 is moved and swung with a hand of the user, the present invention is not limited to such an embodiment. For example, the swinging mechanism 51 and the moving mechanism 55 of the sample adjusting unit 40 may be provided with driving motors, respectively, so that the position adjusting jig 42 can be moved and swung with the driving forces generated by the driving motors.

While the above embodiment concerns a case where the sample adjusting unit 40 includes the moving mechanism 55 that moves the position adjusting jig 42, the present invention is not limited to such an embodiment. For example, the sample adjusting unit may include only the swinging mechanism that swings the position adjusting jig, and the length of projection of the sample may be adjusted on the sample-holder side.

While the above embodiment concerns a case where the sample 14 is positioned by moving and swinging the sample holding portion 26, holding the sample 14, with the sample adjusting unit 40, the present invention is not limited to such an embodiment. For example, the sample holding portion that holds the sample may be fixed to the sample holder, and a shielding-plate-holding portion that holds the shielding plate may be supported in such a manner as to be swingable and movable relative to the sample holding portion. In addition, the sample adjusting unit may be configured such that the positions of the sample and the shielding plate are adjustable by swinging and moving the shielding-plate-holding portion.

While the terms such as "parallel" and "orthogonal" have been used herein, these terms do not necessarily mean the exact "parallel" state and the exact "orthogonal" state. These terms imply states including not only the exact "parallel" state and the exact "orthogonal" state but also any "substantially parallel" state and any "substantially orthogonal" state in which relevant elements can exert their functions.

What is claimed is:

1. A sample holder system comprising:
a sample holder that holds a sample; and
a sample adjusting unit that is disconnectably connected to the sample holder and positions the sample and a mask,
wherein the sample holder includes
a shielding plate that covers part of a processing surface of the sample;
a holder body that holds one of the sample and the shielding plate;
a holding portion that holds another of the sample and the shielding plate and is swingably supported by the holder body; and
a fastening mechanism that fastens the holding portion to the holder body, the fastening mechanism preventing the holding portion from swinging when the holding portion is fastened to the holder body,
wherein the sample adjusting unit includes
a position adjusting jig that comes into contact with the holding portion; and
a swinging mechanism that supports the position adjusting jig such that the position adjusting jig is swingable,
wherein the shielding plate is secured to the holder body,
wherein the holding portion is a sample holding portion that holds the sample,
wherein the sample adjusting unit includes a unit body that supports the position adjusting jig,
wherein the unit body includes a connecting portion that is disconnectably connected to the holder body, and
wherein, when processing the sample with an ion beam after positioning the sample and the mask with the sample adjusting unit, the sample adjusting unit is disconnected and removed from the sample holder and then the sample holder is attached to an ion beam processing device where the sample is processed with the ion beam.

2. The sample holder system according to claim 1,
wherein the holding portion is supported by the holder body in such a manner as to be movable in a projecting direction in which the sample projects from the shielding plate,
wherein when the holding portion is fastened to the holder, the fastening mechanism prevents the holding portion from moving, and
wherein the sample adjusting unit includes a moving mechanism that supports the position adjusting jig such that the position adjusting jig is movable.

3. The sample holder system according to claim 1,
wherein the sample holding portion includes two handle portions on two respective sides in a direction that is orthogonal to the projecting direction and is parallel to the processing surface of the sample, the handle portions holding the sample to be placed in between, and
wherein the position adjusting jig includes two pressing portions that come into contact with the two respective handle portions.

4. The sample holder system according to claim 1,
wherein at least one of the connecting portion and the holder body is provided with a first magnet, and
wherein another of the connecting portion and the holder body is provided with a magnetic member or a second magnet that attracts the first magnet.

5. A sample observation apparatus comprising:
a sample holder system including
a sample holder that holds a sample, and
a sample adjusting unit that is disconnectably connected to the sample holder and positions the sample and a mask;
an attaching stage to which the sample holder is detachably attached; and
an observation unit through which the sample held by the sample holder is observed,
wherein the sample holder includes
a shielding plate that covers part of a processing surface of the sample;
a holder body that holds one of the sample and the shielding plate;
a holding portion that holds another of the sample and the shielding plate and is swingably supported by the holder body; and
a fastening mechanism that fastens the holding portion to the holder body, the fastening mechanism preventing the holding portion from swinging when the holding portion is fastened to the holder body,
wherein the sample adjusting unit includes
a position adjusting jig that comes into contact with the holding portion; and
a swinging mechanism that supports the position adjusting jig such that the position adjusting jig is swingable,
wherein the shielding plate is secured to the holder body,
wherein the holding portion is a sample holding portion that holds the sample,
wherein the sample adjusting unit includes a unit body that supports the position adjusting jig,
wherein the unit body includes a connecting portion that is disconnectably connected to the holder body, and
wherein, when processing the sample with an ion beam after positioning the sample and the mask with the sample adjusting unit, the sample adjusting unit is disconnected and removed from the sample holder and then the sample holder is attached to an ion beam processing device where the sample is processed with the ion beam.

* * * * *